United States Patent [19]

Winkler

[11] 4,306,515

[45] Dec. 22, 1981

[54] VACUUM-DEPOSITION APPARATUS

[75] Inventor: Otto Winkler, Balzers, Liechtenstein

[73] Assignee: Balzers Patent- und Beteilingungs-Aktiengesellschaft, Liechtenstein

[21] Appl. No.: 10,166

[22] Filed: Feb. 7, 1979

Related U.S. Application Data

[63] Continuation of Ser. No. 799,599, May 23, 1977, abandoned.

[30] Foreign Application Priority Data

Jun. 8, 1976 [CH] Switzerland .................. 007177/76

[51] Int. Cl.³ .......................................... C23C 13/08
[52] U.S. Cl. ................................................ 118/724
[58] Field of Search ...................... 118/723, 724, 715; 219/275; 204/298

[56] References Cited

U.S. PATENT DOCUMENTS

| | | | |
|---|---|---|---|
| 2,239,452 | 4/1941 | Williams et al. | 118/715 X |
| 2,398,382 | 4/1946 | Lyon | 118/725 X |
| 2,727,167 | 12/1955 | Alpert | 313/178 X |
| 3,324,825 | 6/1967 | Brumfield | 118/724 X |
| 3,678,889 | 7/1972 | Murakami et al. | 118/720 |
| 3,862,397 | 1/1975 | Anderson et al. | 118/724 X |

FOREIGN PATENT DOCUMENTS 46-38969 11/1971 Japan .................. 118/726

Primary Examiner—Morris Kaplan
Attorney, Agent, or Firm—McGlew and Tuttle; McGlew and Tuttle

[57] ABSTRACT

The vacuum treating device, comprises a housing defining an interior treatment chamber which is connected to a pump for evacuating the chamber. The carrier for holding a product is mounted within the housing in opposition to a holder for the material which is to be vaporized to form a coating. The support structure is mounted within the housing at a spaced location from each of the walls thereof and it provides means for supporting a heatable foil material. In addition, a heater is provided for heating the foil which is located between the foil and the corresponding wall and advantageously comprises a heater which is heatable by an electric current. The heater may be a device, for example, which produces a gas discharge using an electrode. The construction includes an interior frame having posts for supporting the electrical heater and provisions for supporting the foil which advantageously comprises individual magnets which are positioned over the metal frame.

4 Claims, 3 Drawing Figures

VACUUM-DEPOSITION APPARATUS

This is a continuation application of Ser. No. 799,599 filed May 23, 1977 now abandoned.

FIELD AND BACKGROUND OF THE INVENTION

This invention relates in general to the construction of treatment devices and, in particular, to a new and useful vacuum treating device which includes a heating foil suspended in spaced relationship to one of the walls of the chamber with a separate means for heating the foils located between the foils and the chamber walls.

DESCRIPTION OF THE PRIOR ART

In vacuum devices, it is well known that the pumping time for establishing a vacuum is a function of the contamination of the walls and built-in equipment with water. The degree of contamination depends not only on the humidity content of the ambient air coming into contact with the surfaces and on the temperature of the surfaces but, in particular, on the real area of the inside surfaces of the device.

To facilitate water desorption, it has been suggested to heat the walls of the device prior to introducing air, and to keep them at elevated temperatures also during the pumping-down stage. In UHV devices particularly, a heating up to relatively elevated temperatures is necessary in order to be able to obtain the required low final pressures. On the other hand, during a vacuum deposition, in most cases, the wall temperature must be low in order to forestall an emission of gas from the walls during the operation.

In order to obtain deposited layers free from optical absorption, for example, in a reactive vapor deposition of thin layers in an oxygen atmosphere, it is important to keep the partial pressure of water vapor and hydrocarbons as low as possible during the condensation of the layers. On the other hand, in order to obtain satisfactory oxidation, the partial pressure of oxygen must be increased to such values that disadvantageous phenomena occur in the layers, primarily, unsatisfactory hardness and adhesive strength, due to a scattering of the molecules of the evaporated material in the gas atmosphere and to an inclusion of the gas.

In most of the vacuum processes, bounds are set for the temperature interval between heating and cooling; first, because the temperature of the products to be treated is influenced at the same time and, second, because with longer temperature intervals, the cycles become so long that the throughput rate and, thereby, the economy of the operation, is reduced. Also, considering the great heat-absorption capacity of the chamber walls, too much power would be required. For this reason, in actual practice the device is cleaned only from time-to-time, that is as soon as the pumping time for the required final pressure becomes too long or when the quality of the layers begins to suffer.

It is well known to provide heatable inner walls in a vacuum chamber, to be able to de-gas them under vacuum. In cases where this degasification is carried out in a separate operation, which is time-consuming, the chamber must again be opened to introduce the products to be treated and this involves the risk of a new adsorption of $H_2O$ from the humid ambient air. If, on the other hand, in order to expel the gases, the walls are heated prior to the intended treatment, but while the products are already in place in the device, a simultaneous heating of the products is unavoidable. However, this is not permissible in many cases, for example, if sensitive optical glasses are to be coated with thin layers and, in this case, the heating has to be limited to low temperatures, for example, 100° C. which is hardly effective for the degasification.

It is known to provide a vacuum device for treating products which is designed so that the walls can be largely kept free from adsorbed water vapor even after longer use during its operation, without the necessity of simultaneously heating the products or introducing them only after the walls of the treating chamber have cooled. Such a design makes it possible to carry out the desired process without the necessity of a periodical cleaning, and to start each time from technical vacuum conditions which, otherwise, would be obtained only with a device which has just been cleaned. Another advantage is improved economy in operation due to shorter pumping times.

This type of vacuum device, in particular a vacuum deposition apparatus, comprises a treating chamber with a pump connection and equipment for receiving the products and carrying out the desired treatment, and with intermediate, heatable walls located between the inner surface of the treating chamber and the products to be treated a particular feature of this device is that clamping mechanisms for holding exchangable thin metal foils are mounted in the treating chamber and are provided with electrical connections.

In this device, it is advisable to have all locations which are visible from the evaporation sources screened by the heatable foils. The foils are heated in order to desorb the water vapor prior to the vapor deposition. It is even possible, without damaging the evaporated substance, to temporarily raise the temperature of the products to be treated to a level at which, not only $H_2O$, but all adsorbed gases, are removed almost quantitatively. By using thin foils of low thermal inertia to which the desired temperature is imparted after the pre-evacuation of the device, and which can be heated very rapidly and thereupon cooled down again to a temperature of equilibrium, the advantage is obtained that the thermal load of the products remains negligibly small and the gas is expelled completely and largely independently of the thickness of the layers which have already been deposited on the foils during previous processes. In this way, after each such temporary heating operation, conditions of a freshly cleaned device, having a correspondingly short pumping time, are obtained.

However, the above-described operation requires a definite, uniform temperature of the heated foils at the different locations of the walls which may be obtained by adjusting the electrical resistances of the individual foil elements. The problem arising in this respect is to obtain a reliable electrical contact between the foils and the clamping mechanisms through which the current is supplied.

SUMMARY OF THE INVENTION

The present invention is directed to a vacuum device in which the difficulties of the prior art constructions are avoided without losing the advantage of an almost inertialess heating and cooling of the foils.

In accordance with the invention, there is provided a vacuum device for treating products, particularly, a vacuum deposition apparatus, which comprises a treating chamber with a pump connection and means for receiving the products and for performing the desired treatment, and which also includes heatable foils mounted as intermediate walls between the inside surface of the treating chamber and the products to be treated, in which a means for indirect heating is provided to heat the foils, which is located between the foils and the walls of the chamber.

In the simplest design, heating wires strung in the intermediate space are provided as the heating means. The heat may also be produced, however, by a gas discharge in the space between the foil and the chamber wall, with the wires serving as electrodes. The inventive solution offers the advantage that the heating power per surface unit transmitted to the foils can be easily adjusted in accordance with a predetermined program. Since the heat is produced in the space between the foils and the chamber walls, there is no longer need for designing the clamping mechanisms for the foils as current-transmitting contact elements, and this results in substantial economy and simplification in the construction of the device.

Accordingly, it is an object of the invention to provide a vacuum treating device, particularly, a vacuum deposition apparatus, which includes foils supported in a spaced location inwardly from an evacuable chamber which includes a carrier for the material to be coated and a holder for the material to form a vapor coating and, wherein, there is a separate heater provided behind the foils in the space between the foils and the walls for separately heating the foils.

A further object of the invention is to provide a vacuum treating device, particularly, a vacuum deposition apparatus, which is simple in design, rugged in construction and economical to manufacture.

The various features of novelty which characterize the invention are pointed out with particularity in the claims annexed to and forming a part of this disclosure. For a better understanding of the inventin, its operating advantages and specific objects attained by its uses, reference should be had to the accompanying drawings and descriptive matter in which there is illustrated a preferred embodiment of the invention.

DESCRIPTION OF THE PREFERRED EMBODIMENT

Figure 1:
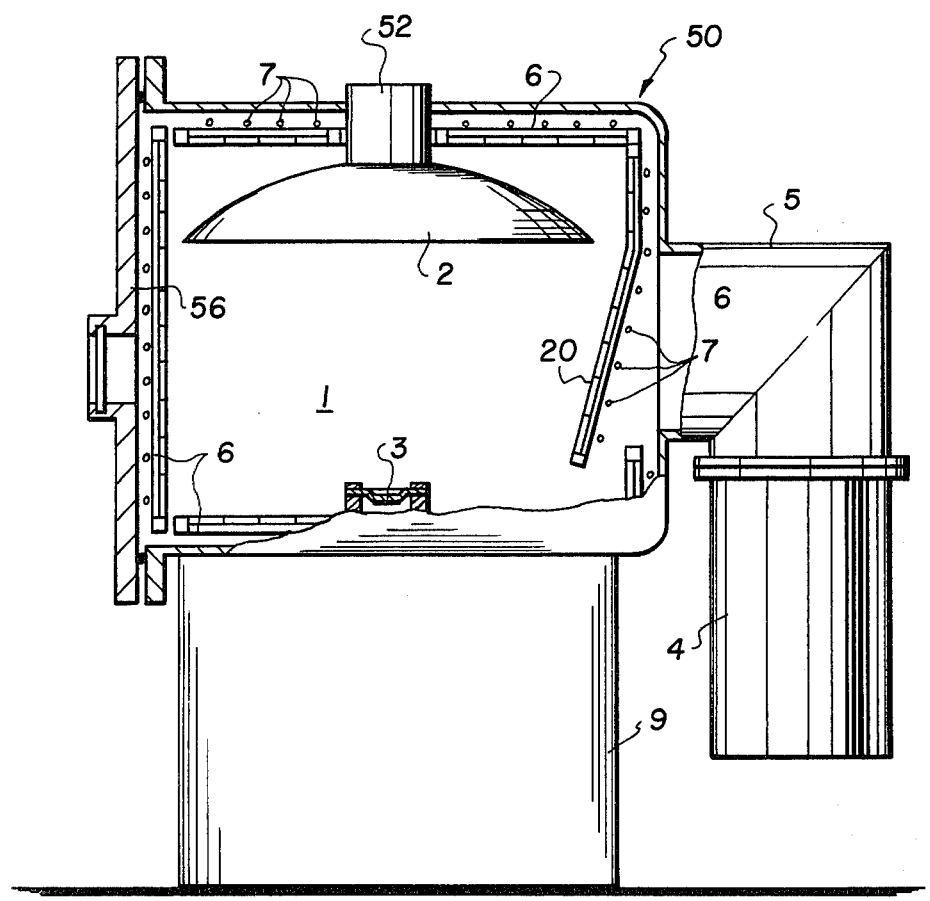
FIG. 1 is a side elevational view, partly in section and partly diagrammatic, of a vacuum-deposition apparatus constructed in accordance with the invention.

Referring to the drawings in particular, the invention embodied therein comprises, a housing 50, defining an evacuable vaporization chamber 1. A cap-shaped carrier 2, provied with a rotational drive 52, is mounted in the housing 1 as a holding structure for the products, for example, lenses to be coated. A vapor source 3 is provided opposite thereto, which comprises, for example, an electrically heatable small cup for the substance to be evaporated. Chamber 1 is connected to a pump defining a diagrammatically indicated pumping station 4. A valve 5 is provided between the pumping station 4 and vacuum chamber 1 making it possible, if desired, to shut-off the chamber after evacuation and to introduce, for example, a pure reaction gas.

The device is further equipped with supporting structures 6 for exchangable heating foils 20. In the space between the foil supports 6 and the chamber walls 56, electrical heating wires 7 are provided, in accordance with the invention, as a means for indirect heating. The wires 7 are supplied with heating current through vacuum-tight bushing insulators 30 and wires 31. Further indicated in FIG. 1 is a supporting frame 9 for vacuum chamber 1.

Figure 2:
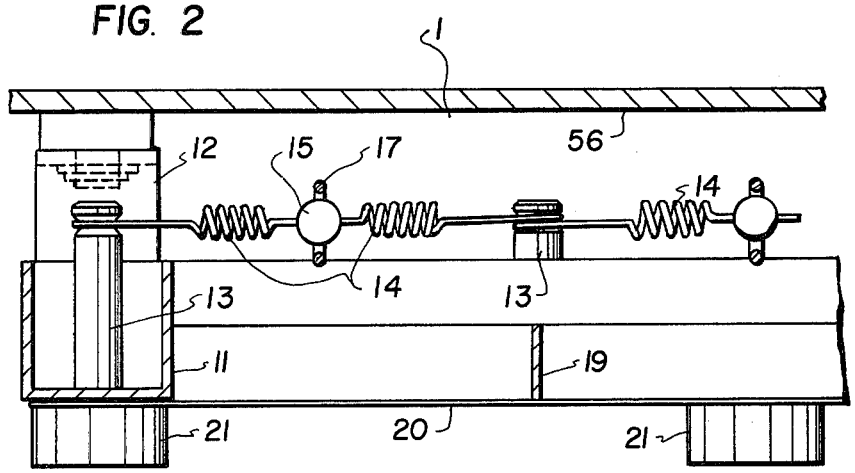
FIG. 2 is an enlarged partial sectional view of a portion of the apparatus shown in FIG. 1.
Figure 3:
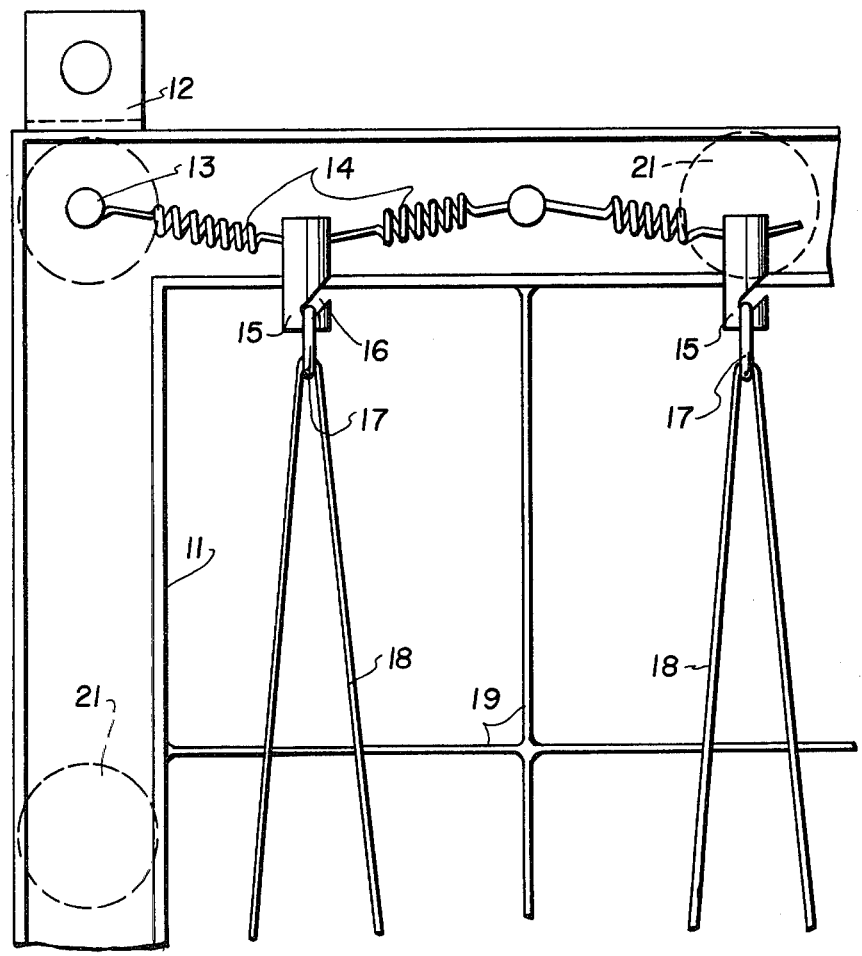
FIG. 3 is a partial top plan view of the apparatus shown in FIG. 1 on an enlarged scale.

FIGS. 2 and 3 show, by way of example, an embodiment of a supporting structure for the foils and the heating wires. As shown in FIG. 2, the supporting structure 6 for one lateral wall of a cubic evaporation chamber may comprise, for example, a steel frame 11 made of channel sections, which is secured to the inside of chamber wall 56 by means of lugs 12. Supporting pins 13 are secured within the channel section to the web portion thereof which are spaced from each other and the heads of which project from the channel to support tension springs 14 extending therebetween. In turn, tension springs 14 support insulators 15 which are provided with recesses 16 from which supporting rings 17 for heating wires 18 can be suspended.

Frame 11 is further provided with a plurality of cross-webs 19 forming a grating which is flush with the front face of frame 11 and against which foils 20 rest. A plurality of retaining magnets 21 is provided for holding foils 20 in place, each of which is secured to steel frame 11, so as to hold the foils to the front face of the frame.

In a manner similar to that described in the foregoing, additional foil supporting structures may be associated with the other chamber walls and with any built-in equipment, for example, cap-shaped carrier 2, and conformed thereto. Aside from the wall portions 56 of the chamber, the evacuation opening may also be protected against penetration of dirt particles and, in vapor deposition apparatus, against penetration of the evaporated substance. Such a screening of the evacuation opening is shown, by way of example, in FIG. 1.

Foils 20, having a thickness of 0.1 mm or even less, are preferably used. Where degasification temperatures of about 400° C. are sufficient, cheap aluminum foils can be used or, for higher temperatures, steel foils may be employed. After repeated use, the foils, which are already coated with a layer of substance deposited during the preceding processes, are replaced by new ones. This results in a very economical operation as compared to the hitherto usual frequent cleaning of the device.

In some cases, a higher temperature of the substrates is desired during the vapor deposition, for example, in order to obtain an improved adhesive strength of the deposited layers. In such a case, the inventive device may advantageously be used for keeping the walls of the evaporation chamber on all sides at the same temperature even during the vaporization process, by a suitably adjusted heating capacity. This prevents temperature gradients in the substrates from being coated, which also substantially reduces any risk of a distortion or cracking of these substrates (for example, lenses) due to non-uniform heating. In addition, in such cases, the layers deposited at a higher temperature on the foils adhere more strongly, so that they have less tendency to peel upon repeated cooling and heating, and thicker layers may be tolerated before a necessary exchange of the foils.

Since, with the use of a high-duty heating conductor, such as molybdenum or titanium, the mass of the resistance wire may be very small, the inventive arrangement makes it possible to heat the foil and can be used to cool it down again within a few seconds.

The indirect heating with a resistance wire secured to insulators makes it possible to further improve the pumping process. That is, the possibility is thereby also given to activate the degasification of the chamber walls. During the temporary heating of the foil, the temperature of the wall remains substantially unchanged, and thus, its rate of degasification is not influenced. Even though the initial clean-surface conditions, due to the screening foils, grow worse only slowly with time, the outgassing is not negligible. Even in a clean condition, the chamber wall adsorbs gases, particularly water vapor, even through in a smaller amount as compared to the foil exposed to vapor deposition, and this absorption occurs every time the device is opened. The slow desorption of these gases is more important for the pumping time the more completely the foils are degassed. Therefore, the pumping time may be further substantially reduced by succeeding in accelerating the desorption of the gases from the chamber walls. This is made possible by the use of the resistance wire as an electrode to produce a gas discharge in the intermediate space between the foil screen and the chamber wall. This gas discharge becomes particularly effective if the resistance wire is connected as an anode, so that the chamber wall is subjected to a cathode sputtering.

It is true that gas discharges have already been used in evaporation apparatus, for conditioning the substrates. In such cases, however, the chamber wall acted as the anode, since otherwise, there would be a risk of contaminating the surface of the substrate. However, if the chamber wall is completely screened, this disturbing effect does not take place. In order to activate the desorption on the chamber wall, it is sufficient to apply a high AC voltage to the resistance wire.

If the wattage of the gas discharge is sufficiently high, the screening foil is heated to a temperature which may even be adequate for degassing the foil. In such a case, the ohmic load of the resistance wire, if not wanted for producing an assisted discharge, becomes unnecessary, and the cleaning process remains, based on the gas discharge.

If a high-melting material with getter properties, such as titanium, is used as the resistance or electrode material, a further pumping effect, in addition, may be produced by heating this material up to the temperature of sublimation or by sputtering it, which may be limited to suitable, selected areas, for example, in an evaporation apparatus, above the cap-shaped carrier. This provision is purposeful and effective in cases where it is desired to work at very low pressures, below $10^{-6}$ mbar. In this way, i.e., at least at low pressures, the pumping time can be reduced even further.

Of course, the novel solution can be applied not only to evaporation apparatus, but also to other vacuum processes in which a reduction of the pumping time is useful and determined by the desorption of walls, for example, in vacuum devices for thermally treating reactive metals, where particularly low partial pressures of water vapor are required, and, generally, in the production of ultra-high vacuums.

While a specific embodiment of the invention has been shown and described in detail to illustrate the application of the principles of the invention, it will be understood that the invention may be embodied otherwise without departing from such principles.

What is claimed is:

1. A vacuum treating device for treating a product with vapor from a vapor source material, comprising a housing having walls defining a treatment chamber therein, pump means connected to said housing for evacuating said treatment chamber, a carrier for holding the product to be treated in said housing, holding means for holding the vapor source material in spaced relationship to said carrier, a support adjacent said walls of said housing within said chamber, a heatable foil supported on said support structure and separating a space between the foil and said walls from the interior of said chamber having said carrier and said holding means for shielding substantially all of said walls from said carrier and said holding means, and indirect heating means separate from said foil in the space between said walls and said foil for heating said foil whereby said walls and said interior of said chamber are protected from contaminating each other, said heating means includes wires provided in the space between said foil and chamber walls and means for connecting an electric current to said wires for heating said coil, said wires provide a gas discharge electrode for producing an electric gas discharge.

2. A vacuum treating device, as claimed in claim 1, wherein said wires are made of a getter material.

3. A vacuum treating device, as claimed in claim 1, wherein said support includes a frame including channel portions at each corner thereof, a supporting pin carried in each channel portion, and said heating wires extending between adjacent support pins.

4. A vacuum treating device, as claimed in claim 3, wherein said heatable foil comprises thin metal foil sheets, said frame is made of magnetically attractable metal and said support further includes a magnet overlying said sheets and attracted to said frame.

* * * * *